United States Patent [19]

Mito

[11] Patent Number: 4,622,674
[45] Date of Patent: Nov. 11, 1986

[54] SINGLE LONGITUDINAL MODE SEMICONDUCTOR LASER

[75] Inventor: Ikuo Mito, Tokyo, Japan

[73] Assignee: NEC, Tokyo, Japan

[21] Appl. No.: 608,045

[22] Filed: May 7, 1984

[30] Foreign Application Priority Data

May 9, 1983 [JP] Japan .................................. 58-80378

[51] Int. Cl.$^4$ ............................................... H01S 3/19
[52] U.S. Cl. ...................................... 372/45; 372/48; 372/50; 372/96
[58] Field of Search ...................... 372/44, 45, 46, 48, 372/50, 96, 19

[56] References Cited

U.S. PATENT DOCUMENTS 4,464,762  8/1984  Furuya ................................... 372/50

OTHER PUBLICATIONS

Walpole et al., "Distributed Feedback $Pb_{1-x}Sn_x Te$ Double-Heterotructure Lasers", *APL* vol. 29, No. 5, 1 Sep. 1976, pp. 307-309.

*Primary Examiner*—James W. Davie
*Attorney, Agent, or Firm*—Sughrue, Mion, Zinn Macpeak & Seas

[57] ABSTRACT

A single longitudinal mode semiconductor laser having a distributed Bragg reflector with increased diffractive efficiency. The increased diffractive efficiency results from placing the diffraction grating within the optical waveguide, rather than on either its upper or its lower face. This placement enables maximization of the electric field component of light beams subjected to periodic variations in the refractive index within the optical waveguide, in turn enabling increased reflecting power which results in a low oscillation threshold and a high differential quantum efficiency.

16 Claims, 10 Drawing Figures

SINGLE LONGITUDINAL MODE SEMICONDUCTOR LASER

BACKGROUND OF THE INVENTION

The present invention relates to a single longitudinal mode semiconductor laser suitable as a light source for optical fiber communication systems.

As the transmission loss of optical fibers has been drastically reduced to no more than 0.2 to 0.5 dB/km in the 1.3 and 1.5 micron wavelength bands, it has become possible to realize an optical fiber communication system having a relaying distance of more than 100 km. In long-distance transmission, the transmissible relaying distance and capacity are limited not only by the transmission loss of optical fibers but also by wavelength dispersion. The effect of wavelength dispersion is remarkable in long-distance optical fiber transmission using the conventional Fabry Perot reservoir type semiconductor lasers, which usually have a plurality of oscillating longitudinal modes.

Realization of a long-distance large-capacity optical fiber communication system would require semiconductor lasers capable of oscillating in a single longitudinal mode even in high-speed modulation.

Such semiconductor lasers include the distributed feedback laser diode (DFB LD) with a built-in diffraction grating having a periodic structure and the distributed Bragg reflector laser diode (DBR LD). These semiconductor lasers, which can select the oscillation longitudinal mode, are still in the process of research and development, and only recently became capable of continuous operation at room temperature. There is a long way to go before they can be successfully practicable because they are inferior to the conventional Fabry Perot oscillator type semiconductor laser in such basic areas as oscillation threshold and differential quantum efficiency. The DFB LD and the DBR LD are deficient because they have lower equivalent reflecting power than the conventional semiconductor laser. This condition results from the weak coupling between light and the periodic structure constituting the diffraction grating, resulting in a poor light diffraction efficiency. In a DBR LD, for instance, a low reflecting power in the diffraction grating results in an increase in injection current required for laser oscillation.

Moreover, as the region in which the grating is formed has to be made as long as possible in order to increase the reflecting power in the diffraction grating section, the overall element length is inevitably extended to around 1 mm. There are other disadvantages relating to element performance and fabrication.

SUMMARY OF THE INVENTION

An object of the present invention is to provide a high performance distributed Bragg reflector type single longitudinal mode semiconductor laser, with its equivalent reflecting power increased by structuring the grating section for highly efficient coupling of the periodic structure and light.

A semiconductor laser diode, in accordance with the present invention, comprises a distributed Bragg reflector formed on a substrate. The reflector includes an optical waveguide sandwiched between first and second cladding regions formed over the substrate, the optical waveguide having a corrugated region extending within the optical waveguide in a direction parallel to the surface of the substrate. The thickness of the corrugated region varies in a prescribed period and the refractive index of the corrugated region differs from that of the optical waveguide. An optically active layer formed over the substrate is butt-jointed to the optical waveguide, and emits light beams when a current is injected into it.

BRIEF DESCRIPTION OF THE DRAWINGS

Other advantages and features of the present invention will become apparent from the following detailed description taken in conjunction with the accompanying drawings, wherein.

DETAILED DESCRIPTION OF THE PREFERRED EMBODIMENTS

Before describing the preferred embodiments, the basic principle underlying the present invention will be explained.

Figure 1:
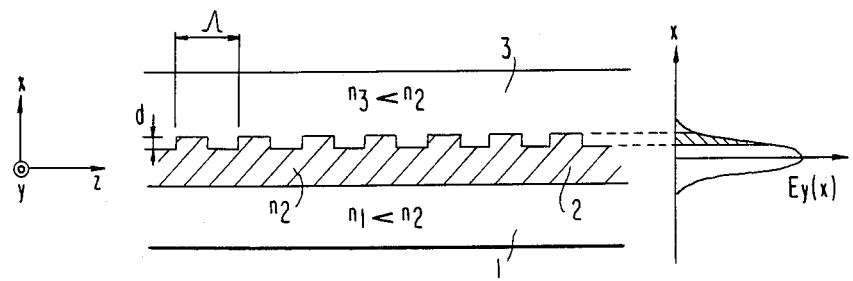
FIG. 1 shows, together with the field distribution in the waveguide, a longitudinal section of a prior art distributed Bragg reflector.

FIG. 1 shows a sectional view of a diffraction grating constituting a prior art distributed Bragg reflector, wherein semiconductor layers 1 and 3 having refractive indices $n_1$ and $n_3$, respectively, sandwich between them a semiconductor optical waveguide layer 2 having a refractive index $n_2$, which is greater than both $n_1$ and $n_3$. Over the top of the optical waveguide layer 2 is formed a periodic structure having a period $\Lambda$ and a depth d. With the x axis set in the direction of lamination, the y axis in a direction normal to the face of the figure within the semiconductor film face, and the z axis in a direction parallel to same, a light beam entering the optical waveguide 2 of the distributed Bragg reflector in the direction of the z axis from the lefthand side of the figure propagates within this optical waveguide layer 2 because $n_2$ is greater than $n_1$ and $n_3$. As the film thickness of the optical waveguide layer 2 varies in the period $\Lambda$, the effective refractive index $\bar{n}_2$ of the layer 2 also periodically varies along the z axis. Light beams of the Bragg wavelength $\lambda_B$, which equals $2m\Lambda\bar{n}_2$ (m: an integer), are greatly diffracted. Therefore, light beams of the Bragg wavelength along are distributively reflected while they propagate through the optical waveguide layer 2, and are returned to the side from which they came. The distributed Bragg reflector semiconductor laser uses such a wavelength-selective Bragg reflector as the semiconductor laser reflector instead of the usual cleaved face. Semiconductor lasers having such a structure have been described in U.S. Patent Application Ser. No. 447,553, filed on Dec. 7, 1982, and Ser. No. 541,211, filed on Oct. 12, 1983, both by the present inventor.

The maximum value of the reflecting power $R_B$ in this waveguide is given by the following equation:

$$R_{B,max} = \tan h^2 (KL)$$

where K is the coupling constant of corrugation and L, the length of the waveguide. Because the reflecting power $R_{B,max}$ increases with K and L, performance improvements, including reduction of the oscillation threshold of the semiconductor laser, can be achieved by maximizing the product KL. However, merely enlarging L while keeping K small would result in increased loss, owing to the absorption of light during propagation through the optical waveguide 2, among other causes. Therefore, the enlargement of K is vital to improving the performance of the semiconductor laser.

K is given by the following equation:

$$K = A \int_{-\infty}^{\infty} \{\Delta \bar{n} (x)\}^2 \cdot \{\epsilon_y(x)\}^2 \, dx$$

where $\epsilon_y(x)$ is the electric field distribution of light beams in the y direction and $\Delta\bar{n}(x)$ is the variation of the effective refractive index.

The greater the depth d, the greater the effective refractive index variation. Thus, the greater the depth d and the greater the electric field component of light beams in this region, the larger K will be.

In the prior art structure of FIG. 1 where a periodic structure is formed on the upper (or lower) face of the optical waveguide layer 2, the electric field component of light beams is small in the region in which the refractive index periodically varies, as is indicated by the distribution of the electric field of optical beams, which is determined by the geometric form in FIG. 1. Therefore, it is difficult to obtain a large value of K.

Figure 2:
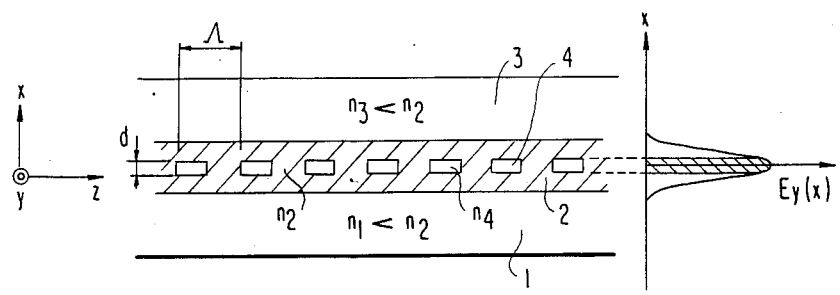
FIG. 2 shows the field distribution in the waveguide and a longitudinal section of a distributed Bragg reflector for use in the present invention.

FIG. 2 shows a sectional view of a distributed Bragg reflector to be used in the present invention. Substantially along the center line of an optical waveguide layer 2 are periodically formed semiconductor layers 4 having a refractive index $n_4$, which is different from the refractive index $n_2$ of the optical waveguide layer 2 (it may be either greater or smaller than $n_2$). In this manner, the electric field component of light beams subjected to the periodic variations of the refractive index, as illustrated by the electric field distribution of light beams in FIG. 2, can be maximized, so that the value of K can be increased.

In the case where 60 to 90 percent of light beams are confined within the optical waveguide 2, the magnitude of the electric field of light beams in the central section of the optical waveguide layer 2 is from three to ten times greater than that of the electric field of light beams on the waveguide's upper or lower face. Accordingly, the structure of FIG. 2 can make the value of K from 10 to 100 times greater than that of FIG. 1. Although, in practice the electric field distribution of light beams in the structure of FIG. 2 is somewhat deformed as the effective refractive index drops in the middle of the optical waveguide layer 2, clearly the structure can make K larger than can the structure of FIG. 1. Therefore, the reflecting power $R_B$ can be increased, resulting in a remarkable improvement of the performance characteristics of the distributed Bragg reflector semiconductor laser.

Figure 3:
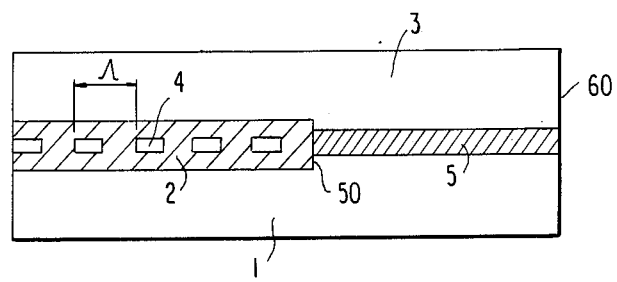
FIG. 3 shows a longitudinal section of the basic structure of the distributed Bragg reflector according to the invention.

FIG. 3 shows a sectional view of the basic composition of the distributed Bragg reflector semiconductor laser according to the invention. The distributed Bragg reflector illustrated in FIG. 2 is shown on the lefthand side of the figure, and an active layer 5, having a narrower forbidden band width than the optical waveguide layer 2, is butt-jointed to the optical waveguide layer 2 at a connection point 50. Both the optical waveguide layer 2 and the active layer 5 are sandwiched between semiconductor layers 1 and 3 having wide forbidden bands and respective smaller refractive indices $n_1$ and $n_3$. An end face 60 of the active layer 5 on the righthand side of the figure is a reflective face. If the semiconductor layers 1 and 3 are n and p types, respectively, there will be a double heterostructure in which a pn junction is formed at the active layer 5, so that the injected carrier will be efficiently confined within the active layer 5 to emit light beams.

The light beams so emitted are guided within the active layer 5, and those proceeding toward the lefthand side of the figure strike the optical waveguide layer 2 of the reflected Bragg reflector via the connection point 50. Out of the light beams striking the distributed Bragg reflector, those with Bragg wavelengths are strongly diffracted and return to the active layer 5. Therefore, the distributed Bragg reflector, together with the reflector on the end face 60 of the active layer 5 on the righthand side of the figure, constitutes a wavelength-selective resonator.

The distributed Bragg reflector semiconductor laser of this structure is characterized by the high reflecting power of its distributed Bragg reflector and by the butt-jointing of the active layer 5 and the optical waveguide layer 2 for a light beam coupling efficiency of more than 90 percent, resulting in a low ocillation threshold and a high differential quantum efficiency.

Figure 4:
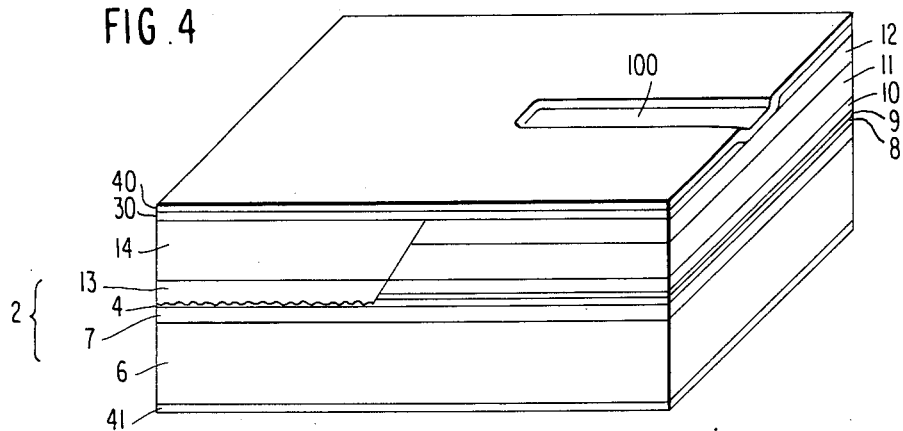
FIG. 4 shows an oblique view of a distributed Bragg reflector laser diode (DBR LD) constituting a first preferred embodiment of the invention.

FIG. 4 shows an oblique view of the distributed Bragg reflector semiconductor laser, which is a first preferred embodiment of the present invention. Its structure will be described below with reference to the fabrication procedure illustrated in FIGS. 5a to 5d.

Figure 5A:
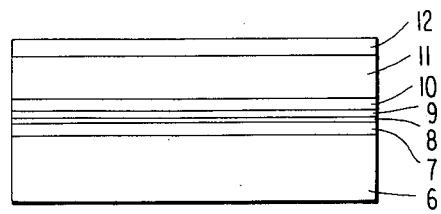
FIGS. 5a to 5d show sectional views for describing the fabricating process of the semiconductor laser diode illustrated in FIG. 4.
Figure 5B:
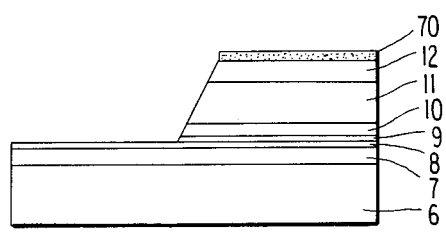

InGaAsP layers and InP layers are used as semiconductor materials. A distributed Bragg reflector is structured to take advantage of the InGaAsP layers (having a 1.15 micron composition in terms of the wavelength of the light emitted) having greater refractive indices than do the InP layers. A first optical waveguide layer 7 of n-InGaAsP (1.15 micron composition in terms of light wavelength, 0.3 micron thick), an n-InP layer 8 (0.1 micron thick), an active layer 9 of non-doped InGaAsP (1.3 micron composition in terms of light wavelength, 0.15 micron thick), a second optical waveguide layer 10 of p-InGaAsP (1.15 micron composition in terms of light wavelength, 0.2 micron thick) are successively grown on an n-InP substrate 6 by liquid-phase epitaxy (LPE), a first cladding layer 11 of p-InP (2 microns thick) and an electrode forming layer 12 of p-InGaAsP (1.2 micron composition in terms of light wavelength, 1 micron thick). The resultant wafer is illustrated in FIG. 5a. Then, as shown in FIG. 5b, the region on the lefthand side of the figure is etched, the rest being masked with an $SiO_2$ film 70, to expose the n-InP layer 8. Sulfuric acid-based and hydrochloric acid-based etching liquids can be used selectively to etch InGaAsP semiconductor layers and InP semiconductor layers, respectively.

Figure 5C:
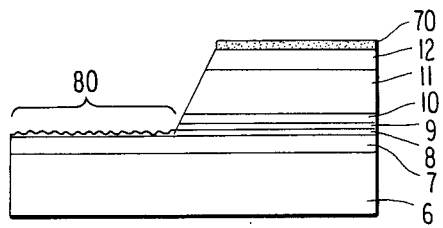
Figure 5D:
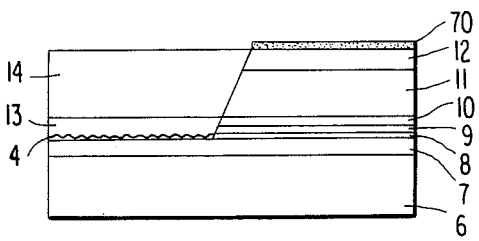

Next, a primary diffraction grating 80 having a period of 1980 Å is formed in the n-InP layer 8 by the conventional holographic interference exposure method using He-Cd gas laser and etching. The result is illustrated in FIG. 5c. With the SiO$_2$ film 70 being used as growth inhibiting mask, a second round of LPE growth is achieved to grow a third optical waveguide layer 13 of p-InGaAsP (1.15 micron composition in terms of light wavelength, 0.4 micron thick) and a second cladding layer 14 of p-InP (3 microns thick). The result is shown in FIG. 5d. After removing the SiO$_2$ film 70 and newly forming a SiO$_2$ insulating film 30 all over, a 10 micron current injecting striped region 100 for injecting an electric current is opened on the electrode forming layer 12, and then a p-side metal electrode 40 of Au-Zn is formed. Next, after the side of the n-InP substrate 6 is ground until the overall thickness is reduced to about 100 microns, an n-side electrode 41 of Au-Ge-Ni is formed, cleaved and cut out to obtain an element having the structure illustrated in FIG. 4.

In this structure, the optical waveguide 2, including the first optical waveguide layer 7 of InGaAsP, the third optical waveguide layer 13, and the corrugated layer 4 of InP sandwiched between the two optical waveguide layers, constitutes a distributed Bragg reflector, placed between the InP substrate and the second cladding layer. The optical waveguide in the light emitting region adjoining this distributed Bragg reflector includes the first optical waveguide layer 7, the second optical waveguide layer 10, the active layer 9 sandwiched between the two optical waveguide layers, and the InP layer 8 having the same composition as the corrugated layer 4. The waveguide in the light emitting region is enclosed by the substrate 6 having a low refractive index and the first cladding layer 11.

When the region containing the active layer 9 and the distributed Bragg reflector section, respectively, are 300 microns and 500 microns long, the element has an oscillation threshold of approximately 150 mA and a differential quantum efficiency of approximately 15 percent on one side. The element's oscillating wavelength is around 1.30 microns, and a single longitudinal mode of up to about 2.5 times the oscillation threshold is maintained in the injected current region. The oscillating wavelength, which is dependent on the heat sink temperature, varies at a rate of 1.0 Å/°C. This quantity corresponds to the temperature-dependent variation of the refractive index, and is substantially equal to previously reported values. The satisfactory oscillation threshold and differential quantum efficiency result from the high reflecting power in the distributed Bragg reflector section.

Figure 6:
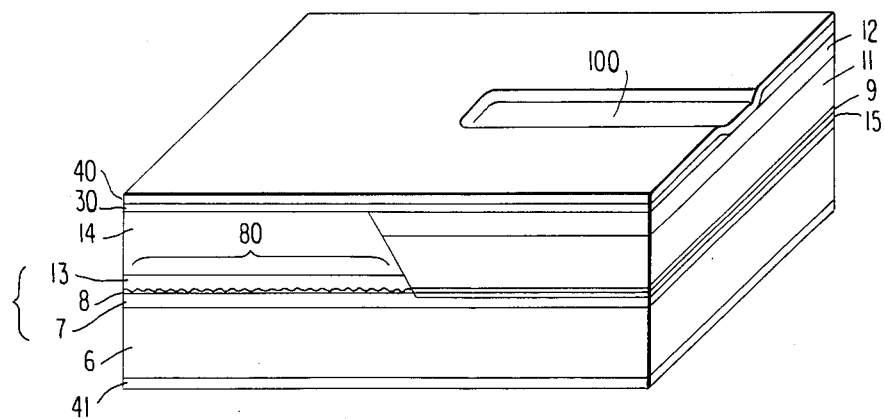
FIG. 6 shows an oblique view of a semiconductor laser diode constituting a second preferred embodiment of the invention.

FIG. 6 shows an oblique view of a second preferred embodiment of the present invention. The structure of its distributed Bragg reflector section is the same as in the first embodiment illustrated in FIG. 4. This second embodiment differs from the first in that the active layer 9 is produced after the formation of the distributed Bragg reflector section. Thus, after a first optical waveguide layer 7 of n-InGaAsP (1.15 micron composition in terms of light wavelength, 0.2 micron thick) and an n-InP layer 8 (0.1 micron thick) are grown on an n-InP substrate 6 by the first round of LPE growth, a diffraction grating 80 having a period of 1980 Å is formed in the n-InP layer 8.

In the second round of LPE, a third optical waveguide layer 13 of p-InGaAsP (1.15 micron composition in terms of light wavelength, 0.2 microns thick) and a second cladding layer 14 of p-InP (3 microns thick) are grown. Then, as in the case of the first embodiment, partial etching to the n-InGaAsP waveguide layer 7 is achieved by the use of hydrochloric acid-based and sulfuric acid-based selective etching liquids. In the third round of LPE growth, a buffer layer 15 of n-InP (0.3 micron thick), an active layer 9 of non-doped InGaAsP (1.3 micron composition in terms of light wavelength, 0.15 micron thick), a cladding layer 11 of p-InP (2.2 microns thick) and an electrode forming layer 12 of p-InGaAsP (1.2 micron composition in terms of light wavelength, 1 micron thick) are formed, only in the etched part, by using an SiO$_2$ growth inhibiting mask over the second cladding layer 14 of p-InP. The LPE growth procedure ends here, and the remaining electrode forming step is the same as in the first embodiment.

In this second embodiment, the first optical waveguide layer 7, the corrugated layer 8 and the third optical waveguide layer 13 constitute an optical waveguide, and provide a distributed Bragg reflector. The optical active layer 9 adjoins the corrugated layer.

An element of this structure has substantially the same performance characteristics as the first embodiment, its oscillation threshold being 150 mA and its differential quantum efficiency about 15 percent on one side. Its oscillating waveguide is around 1.30 microns in a single longitudinal mode.

In the first and second embodiments having gain waveguide-type semiconductor laser structures, no waveguide is formed in a plane normal to the laminating direction in the distributed Bragg reflector section. Consequently, only a small proportion of the light beams striking the distributed Bragg reflector return to the light emitting region of the active layer 9. If a waveguide connected to the light emitting region of the active layer 9 is formed in the distributed Bragg reflector section as well, performance will further improve.

Figure 7:
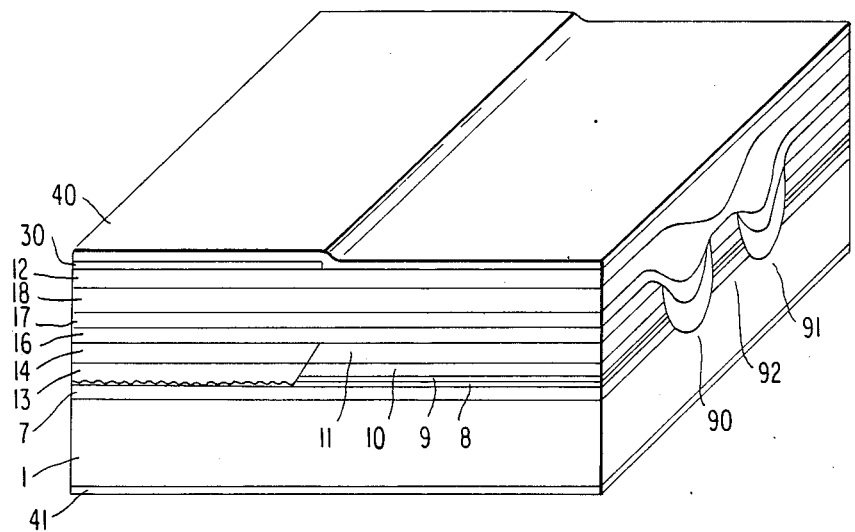
FIG. 7 shows an oblique view of a semiconductor laser diode constituting a third preferred embodiment of the invention.

FIG. 7 shows an oblique view of a third preferred embodiment of the present invention, having a buried heterostructure formed on the basis of the structure of the first embodiment. After removing the electrode forming layer 12 of p-InGaAsP from the structure of the first embodiment illustrated in FIG. 5d and producing a multilayer wafer in which the cladding layer 11 of p-InP and the second cladding layer 14 of p-InP are each 1 micron thick two parallel grooves 90 and 91 are formed in the same direction as the striped region 100 of FIG. 6, so each groove is about 7 microns wide, and a mesa stripe 92, formed between the two grooves 90 and 91, is about 2 microns wide. A current blocking layer 16 of p-InP and a current confining layer 17 of n-InP, each about 0.5 micron thick in its flat part, are grown so that they may not grow over the mesa stripe 92. Then, an embedding layer 18 of p-InP (1.5 microns thick in its flat part) and an electrode forming layer 12 of p-InGaAsP (1.2 micron composition in terms of light wavelength, 1 micron thick in its flat part), are grown, covering the whole structure, so as to form a wafer of buried structure. (For further details on a buried structure, reference may be made to the U.S. Patent Applications Ser. Nos. 447,553, U.S. Pat. No. 4,575,851 and 541,211). Whereas the electrode forming step is the same as that for the first embodiment, an SiO$_2$ insulating film 30 is required only over the distributed Bragg reflector section because there is a current confining structure within.

In this structure, a rectangular waveguide, extending from the light emitting section including the active layer 9 to the distributed Bragg reflector section, is formed in the mesa stripe 92. As a result, most of the light beams diffracted by the distributed Bragg reflector section return to the waveguide of the active layer 9. When the region of the active layer 9 and the distributed Bragg reflector are 300 microns and 500 microns long, respectively, the oscillation threshold of the element will be 30 mA and the differential quantum efficiency will be 20 percent on one side, both satisfactory quantities. Its oscillating wavelength is around 1.30 microns, and has a single mode where the injected current is no more than approximately three times the oscillation threshold. The oscillating wavelength, which is dependent on the heat sink temperature, varies at a rate of about 1 Å/°C., which is substantially equal to the variations in the first and second embodiments.

The buried structure can be applied as effectively to the structure of the second embodiment.

Although InP substrates are used in the foregoing embodiments, it is also possible to use an $Al_xGa_{1-x}As$-based material or an InGaAsP-based material on a GaAs substrate.

To summarize, a distributed Bragg reflector having a high diffractive efficiency can be formed by arranging the periodic variation of the refractive index about in the middle of the waveguide. Such a structure will have a low oscillation threshold and a high differential quantum efficiency.

What is claimed is:

1. A semiconductor laser diode comprising:
   a substrate;
   an optical waveguide, sandwiched between first and second cladding regions and formed over a first portion of the substrate, for feeding back radiation propagating therethrough, the optical waveguide having a corrugated region extending within the optical waveguide in a direction parallel to the surface of the substrate, the thickness of the corrugated region varying in a prescribed period and the refractive index of the corrugated region differing from that of said optical waveguide;
   an optically active layer defined by opposite flat boundaries, butt-jointed to said optical waveguide and formed over a second portion of said substrate, for emitting radiation when a current is injected into it; and
   a pair of electrodes for supplying an injection current to said optically active layer.

2. A semiconductor laser diode according to claim 1, said corrugated region comprising physically separate, periodically-spaced rectangular sections within said optical waveguide and having a refractive index different from that of said optical waveguide.

3. A semiconductor laser diode, comprising:
   a substrate of n-type semiconductor material;
   a first electrode formed on the underside of said substrate;
   a first optical waveguide layer of n-type semiconductor material, formed over said substrate;
   a diffraction grating of n-type semiconductor material, formed over part of said first optical waveguide layer;
   a layer of n-type semiconductor material, butt-jointed to said diffraction grating;
   an optically active layer of non-doped semiconductor material, formed over said butt-jointed semiconductor layer;
   a second optical waveguide layer of p-type semiconductor material, formed over said optically active layer;
   a third optical waveguide layer of p-type semiconductor material, formed over said diffraction grating and adjoining said optically active layer and said second optical waveguide layer at the butt end;
   a first cladding layer of p-type semiconductor material, formed over said second optical waveguide layer;
   an electrode forming layer of p-type semiconductor material, formed over said first cladding layer;
   a second cladding layer of p-type semiconductor material, formed over said third optical waveguide layer, and adjoining said first cladding layer and said electrode forming layer at its butt end;
   an insulating film, formed over said second cladding layer and also formed over all but a striped region in said electrode forming layer; and
   a second electrode, formed over said insulating film.

4. A semiconductor laser diode as claimed in claim 3, wherein said first optical waveguide layer, said diffraction grating, and said third optical waveguide layer form an optical waveguide.

5. A semiconductor laser diode as claimed in claim 4, wherein said diffraction grating comprises physically separate, periodically-spaced rectangular sections.

6. A semiconductor laser diode as claimed in claim 5, wherein said substrate and said third optical waveguide layer have refractive indices lower than that of said first optical waveguide layer.

7. A semiconductor laser diode as claimed in claim 6, wherein said diffraction grating has a refractive index different from that of said first optical waveguide layer.

8. A semiconductor laser diode as claimed in claim 7, wherein said second electrode comprises metal.

9. A semiconductor laser diode as claimed in claim 3, wherein said optically active layer is butt-jointed to said diffraction grating.

10. A semiconductor laser diode, comprising:
    a substrate of n-type semiconductor material;
    a first electrode formed on the underside of said substrate;
    a first optical waveguide layer of n-type semiconductor material, formed over said substrate;
    a diffraction grating of n-type semiconductor material, formed over part of said first optical waveguide layer;
    a layer of n-type semiconductor material, butt-jointed to said diffraction grating;
    an optically active layer of non-doped semiconductor material, formed over said butt-jointed semiconductor layer;
    a second optical waveguide layer of p-type semiconductor material, formed over said optically active layer;
    a third optical waveguide layer of p-type semiconductor material, formed over said diffraction grating and adjoining said optically active layer and said second optical waveguide layer at the butt end;
    a first cladding layer of p-type semiconductor material, formed over said second optical waveguide layer;

a second cladding layer of p-type semiconductor material formed over said third optical waveguide layer and adjoining said first cladding layer at its butt end;

said substrate, said first optical waveguide layer, said butt-jointed semiconductor layer, said optically active layer, said second optical waveguide layer, and said first cladding layer containing two parallel grooves, passing completely through all of said layers except for said substrate, so as to form a mesa stripe between said grooves;

said semiconductor laser diode further comprising:

a current blocking layer of p-type semiconductor material, formed over said second cladding layer and said first cladding layer so as not to grow over said mesa stripe;

a current confining layer of n-type semiconductor material, formed over said current blocking layer so as not to grow over said mesa stripe;

an embedding layer of p-type semiconductor material, formed over said current confining layer and covering the entire structure;

an electrode forming layer of p-type semiconductor material, formed over said embedding layer;

an insulating film, formed over so much of the electrode-forming layer as to cover the area of the distributed Bragg reflector formed by said first optical waveguide layer, said diffraction grating, and said third optical waveguide layer; and a second electrode, formed over said insulating film and over so much of said electrode forming layer as said insulating film does not cover.

11. A semiconductor laser diode as claimed in claim 10, wherein said first optical waveguide layer, said diffraction grating, and said third optical waveguide layer form an optical waveguide.

12. A semiconductor laser diode as claimed in claim 11, wherein said diffraction grating comprises physically separate, periodically-spaced rectangular sections.

13. A semiconductor laser diode as claimed in claim 12, wherein said substrate and said third optical waveguide layer have refractive indices lower than that of said first optical waveguide layer.

14. A semiconductor laser diode as claimed in claim 13, wherein said diffraction grating has a refractive index different from that of said first optical waveguide layer.

15. A semiconductor laser diode as claimed in claim 14, wherein said second electrode comprises metal.

16. A semiconductor laser diode as claimed in claim 10, wherein said optically active layer is butt-jointed to said diffraction grating.

* * * * *